United States Patent
Li

(10) Patent No.: US 12,041,843 B2
(45) Date of Patent: Jul. 16, 2024

(54) FLEXIBLE SUBSTRATE AND METHOD OF MANUFACTURING THE SAME, AND ELECTRONIC DEVICE

(71) Applicant: Shenzhen China Star Optoelectronics Semiconductor Display Technology Co., Ltd., Shenzhen (CN)

(72) Inventor: Linshuang Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/055,564

(22) PCT Filed: Sep. 4, 2020

(86) PCT No.: PCT/CN2020/113367
§ 371 (c)(1),
(2) Date: Nov. 14, 2020

(87) PCT Pub. No.: WO2022/032761
PCT Pub. Date: Feb. 17, 2022

(65) Prior Publication Data
US 2023/0180592 A1 Jun. 8, 2023

(30) Foreign Application Priority Data
Aug. 10, 2020 (CN) .......................... 202010797696.0

(51) Int. Cl.
*H10K 77/10* (2023.01)
*H10K 102/00* (2023.01)

(52) U.S. Cl.
CPC ...... *H10K 77/111* (2023.02); *H10K 2102/311* (2023.02)

(58) Field of Classification Search
CPC ............ H10K 77/111; H10K 2102/311; Y10T 428/2495
See application file for complete search history.

(56) References Cited

U.S. PATENT DOCUMENTS

| | | | |
|---|---|---|---|
| 11,623,977 B2 * | 4/2023 | Okkel | C08G 65/2615 525/450 |
| 2011/0062444 A1 | 3/2011 | Park et al. | |

(Continued)

FOREIGN PATENT DOCUMENTS

| | | |
|---|---|---|
| CN | 103531724 A | 1/2014 |
| CN | 106206945 A | 12/2016 |

(Continued)

OTHER PUBLICATIONS

[NPL-1] Xu (CN 206077834 U), Apr. 5, 2017 (EPO machine translation to English). (Year: 2017).*

(Continued)

*Primary Examiner* — David Sample
*Assistant Examiner* — Donald M Flores, Jr.
(74) *Attorney, Agent, or Firm* — Nathan & Associates; Menachem Nathan

(57) ABSTRACT

A flexible substrate and a method of manufacturing the same, and an electronic device are disclosed. The flexible substrate includes a first flexible substrate, a porous film layer disposed on the first flexible substrate, a second flexible substrate disposed on the porous film layer. The porous film layer is configured to increase adhesion between the first flexible substrate and the second flexible substrate.

20 Claims, 2 Drawing Sheets

(56) References Cited

U.S. PATENT DOCUMENTS

2015/0314576 A1* 11/2015 Sun .................. B32B 27/10
                                                              428/221
2018/0287080 A1* 10/2018 Wang ................. H10K 59/00

FOREIGN PATENT DOCUMENTS

| CN | 206077834 U | * | 4/2017 |
|---|---|---|---|
| CN | 206077834 U | | 4/2017 |
| CN | 107805464 A | | 3/2018 |
| CN | 108531094 A | | 9/2018 |
| CN | 111430301 A | | 7/2020 |
| GB | 923207 A | * | 4/1963 |
| KR | 20150012815 A | | 2/2015 |
| WO | 2017179797 A1 | | 10/2017 |
| WO | 2019233734 A1 | | 12/2019 |

OTHER PUBLICATIONS

[NPL-2] "ePTFE Porosity", International Polymer Engineering (Oct. 24, 2019); <https://ipeweb.com/fluoroflex-eptfe/eptfe-porosity/>. (Year: 2019).*

* cited by examiner

FLEXIBLE SUBSTRATE AND METHOD OF MANUFACTURING THE SAME, AND ELECTRONIC DEVICE

BACKGROUND OF INVENTION

1. Field of Invention

The present invention relates to a technical field of displays, and particularly to, a flexible substrate and a method of manufacturing the same, and an electronic device.

2. Related Art

Flexible substrates are one of the most key components in display panels. Currently, a dual layer flexible substrate is used as a flexible substrate. Even if a lower flexible substrate is damaged during a laser lift-off (LLO) process, an upper flexible substrate can also function as a flexible substrate.

However, due to strong rigid structures in molecular chains of the flexible substrates and interface inertness of the dual layer flexible substrates, bonding force of the dual layer flexible substrates is caused to be not ideal. In repeated high and low temperature manufacturing processes of display panels, there is a risk that adhesion between the duel layer flexible substrates will be reduced, which will cause upper flexible substrates and lower flexible substrates to separate or even fall off, seriously adversely affecting process stability of the display panels and stripping yields of the flexible substrates.

SUMMARY OF INVENTION

The present application is to provide a flexible substrate and a method of manufacturing the same, and an electronic device to improve process stability of a display panel and a stripping yield of a flexible substrate.

The present application provides a flexible substrate, comprising a first flexible substrate; a porous film layer disposed on the first flexible substrate; and a second flexible substrate disposed on the porous film layer; wherein the porous film layer is configured to increase adhesion between the first flexible substrate and the second flexible substrate.

The present application further provides an electronic device, comprising the above-mentioned flexible substrate.

The present application further provides a method of manufacturing a flexible substrate, comprising: forming a first flexible substrate on a glass substrate; forming a porous film layer on the first flexible substrate; forming a second flexible substrate on the porous film layer, wherein the porous film layer is configured to increase adhesion between the first flexible substrate and the second flexible substrate; and separating the first flexible substrate from the glass substrate.

Each of a flexible substrate and a method of manufacturing the same, and an electronic device provided by the embodiments of the present application includes a first flexible substrate, a porous film layer disposed on the first flexible substrate, and a second flexible substrate disposed on the porous film layer. The porous film layer is configured to increase adhesion between the first flexible substrate and the second flexible substrate. Since the porous film layer is added between the first flexible substrate and the second flexible substrate, the adhesion between the first flexible substrate and the second flexible substrate is increased, thereby avoiding a risk of separation or even fall off of a dual layer flexible substrate during a manufacturing process, and improving process stability of a display panel and a stripping yield of a flexible substrate.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
FIG. 1 is a cross-sectional view of a flexible substrate provided by an embodiment of the present application.

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

In the description of the present application, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicates orientation or the orientation or positional relationship based on the positional relationship shown in the drawings, for convenience of description only and the present application is to simplify the description, but does not indicate or imply that the device or element referred to must have a particular orientation in a particular orientation construction and operation, and therefore not be construed as limiting the present application. Moreover, the terms "first" and "second" and the like are used for descriptive purposes only and are not to be construed as indicating or implying relative importance. Thus, features defining "first" or "second" may include one or more of the described features either explicitly or implicitly. In the description of the present application, the meaning of "a plurality" is two or more unless specifically and specifically defined otherwise.

In the present application, unless otherwise explicitly specified or limited, the terms "mounted", "linked", "connected", and like terms are to be broadly understood. For example, it may be a fixed connection, a detachably connection, or an integrally connection, or may be a mechanical connection, electrically connection, or a directly connection.

Alternatively, it can also be connected indirectly through intervening structures, or may be interaction between the two internal communicating elements or two elements. For those of ordinary skill in the art, the specific meaning of the above terms in this application can be understood according to the specific situation.

In the present application, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

The following disclosure provides many different embodiments or examples to achieve different structures of the present application. To simplify the disclosure of the present application, the components and configuration of specific examples are described hereinafter. Of course, they are only illustrative, and are not intended to limit the present application. Further, the present disclosure may repeat reference numerals in different embodiments and/or the reference letters. This repetition is for the purpose of simplicity and clarity, and does not indicate a relationship between the various embodiments and/or set in question. Further, the present application provides various specific examples of materials and processes, but one of ordinary skill in the art may be appreciated that other processes and applications and/or other materials Please refer to FIG. 1. FIG. 1 is a cross-sectional view of a flexible substrate provided by an embodiment of the present application.

As shown in FIG. 1, in one embodiment, a flexible substrate 10 includes a first flexible substrate 12, a porous film layer 13, and a second flexible substrate 14.

The first flexible substrate 12 may be made of yellow polyimide (YPI). Yellow polyimide (YPI) has excellent heat resistance and very low coefficient of thermal expansion (CTE), so it has become the preferred material for flexible substrates. Certainly, it can be understood that the material of the first flexible substrate 12 is not limited to this. In one embodiment, in order to further increase adhesion between the first flexible substrate 12 and the second flexible substrate 14, a thickness of the first flexible substrate 12 is less than 10 microns (μm).

The porous film layer 13 is disposed on the first flexible substrate 12. The porous film layer 13 is configured to increase adhesion between the first flexible substrate 12 and the second flexible substrate 14. In a preferable embodiment, in order to increase adhesion between the first flexible substrate 12 and the second flexible substrate 14, the porous film layer 13 is made of a material including polyimide/inorganic nanohybrid material. Certainly, it can be understood that the material of the porous film layer 13 is not limited to this. In one embodiment, the inorganic nanohybrid material includes at least one of titanium dioxide and silicon dioxide. In one embodiment, in order to increase adhesion between the first flexible substrate 12 and the second flexible substrate 14, the porous film layer 13 has a molecular chain structure including ether bonds and siloxane segments. In one embodiment, the porous film layer 13 has a heat-resistant temperature greater than 500° C. to prevent damage from a high temperature manufacturing process. In one embodiment, in order to increase adhesion between the first flexible substrate 12 and the second flexible substrate 14, the porous film layer 13 has a porosity greater than 50%. In one embodiment, the porous film layer 13 has a thickness less than five μm, so that not only can the adhesion between the first flexible substrate 12 and the second flexible substrate 14 be improved, but also an increase in a thickness of the flexible substrate can be avoided.

The second flexible substrate 14 is disposed on the porous film layer 13, and has a thickness greater than a thickness of the first flexible substrate 12. The second flexible substrate 14 may be made of yellow polyimide (YPI), but is not limited thereto.

Since the porous film layer 13 is added between the first flexible substrate 12 and the second flexible substrate 14, the adhesion between the first flexible substrate 12 and the second flexible substrate 14 is increased, thereby avoiding a risk of separation or even fall off of a dual layer flexible substrate during a manufacturing process, and improving process stability of a display panel and a stripping yield of a flexible substrate.

Figure 2:
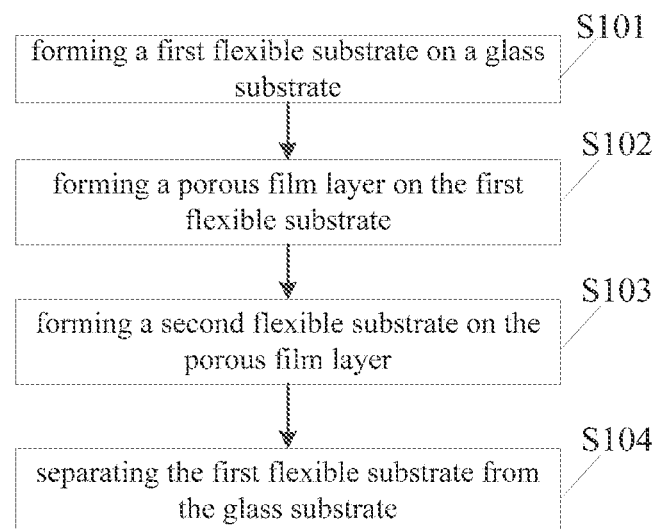
FIG. 2 is a flowchart of a method of manufacturing a flexible substrate provided by an embodiment of the present application.
Figure 3:
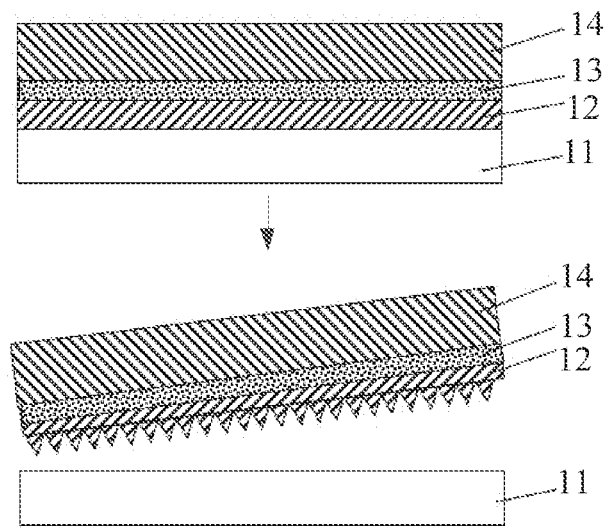
FIG. 3 is a process flow diagram illustrating a method of manufacturing a flexible substrate provided by an embodiment of the present application.

In one embodiment, as shown in FIGS. 2 and 3, the present application further provides a method of manufacturing a flexible substrate. The method includes steps as follows:

S101: forming a first flexible substrate on a glass substrate.

A glass substrate 11 can be a soda lime silicate glass, and upper and lower surfaces of the glass substrate are plain glass plates with flat surfaces. A specific material of the glass substrate 11 is not limited.

For example, the first flexible substrate 12 may be formed by thermal imidization of polyamic acid, but a specific preparation method is not limited to this. In one embodiment, in order to avoid damage to the first flexible substrate 12, the first flexible substrate 12 is prepared under a glass transition temperature greater than 500° C., and/or under a glass transition temperature is less than 3 parts per million (ppm)/° C. In one embodiment, the first flexible substrate 12 may have a thickness less than 10 μm.

S102: forming a porous film layer on the first flexible substrate.

The porous film layer 13 is configured to increase adhesion between the first flexible substrate 12 and the second flexible substrate 14.

In one embodiment, a material of the porous film layer 13 is coated on the first flexible substrate 12, and the coating material is pre-heated to facilitate a subsequent pre-curing process, and the pre-curing process is implemented at a temperature lower than 200° C. A curing rate of the porous film layer 13 after curing is about 50%.

The porous film layer 13 may be formed on the first flexible substrate 12 through slot die coating technique. Certainly, a specific preparation method is not limited to this. In one embodiment, the porous film layer 13 is made of a material including polyimide/inorganic nanohybrid material. The inorganic nanohybrid material may include at least one of titanium dioxide and silicon dioxide. Certainly, the material of the porous film layer 13 is not limited thereto.

In one embodiment, in order to avoid damage to the porous film layer and to improve stability of the flexible substrate, the porous film layer 13 may have a heat-resistance temperature greater than 500° C. In one embodiment, there may be highly flexible ether bonds and siloxane segments in the molecular chain structure of the porous film layer 13. In one embodiment, the siloxane segments with low surface free energy diffuse to a surface of the first flexible substrate 12 to increase adhesion between the porous film layer 13 and the first flexible substrate 12. Since the pre-cured porous film layer 13 has a great number of porous structures, molecular chains of the second flexible substrate 14 can penetrate the porous film layer 13 during a curing process, so that adhesion between the porous film layer 13 and the second flexible substrate 14 is significantly increased. In one embodiment, in order to increase adhesion between the porous film layer 13 and the second flexible substrate 14, the porous film layer 13 has a porosity greater than 50%.

S103: forming a second flexible substrate on the porous film layer.

In one embodiment, yellow polyimide may be coated on the porous film layer 13 and cured simultaneously with the pre-cured porous film layer 13 to obtain the second flexible substrate 14. That is, while the porous film layer 13 is cured, the second flexible substrate 14 is also cured, thereby simplifying a manufacturing process. In order to improve curing effects, in one embodiment, a curing temperature may be greater than 400° C. A curing method can be thermal curing.

Specifically, a thickness of the porous film layer 13 after curing may be less than 5 μm.

In one embodiment, the second flexible substrate 14 may have a thickness greater than that of the first flexible substrate 12, and the thickness of the second flexible substrate 14 is less than 20 μm.

S104: separating the first flexible substrate from the glass substrate.

For example, the first flexible substrate can be separated from the glass substrate 11 by a laser lift off (LLO) method. Certainly, a specific separation method is not limited to this.

Figure 4:
FIG. 4 is a schematic structural view of a display panel provided by an embodiment of the present application.

As shown in FIG. 4, the present application further provides a display panel 100, including any one of the flexible substrates 10 as described above. In addition, the display panel further includes a display portion 20 disposed on the flexible substrate 10. The display portion 20 includes a plurality of subpixels, which may be organic light-emitting diodes. The display panel 100 may be an organic light-emitting diode display panel or a liquid crystal display panel.

Figure 5:
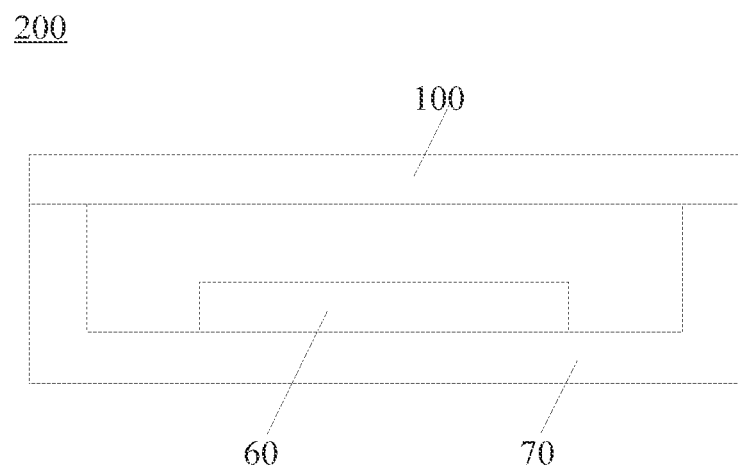
FIG. 5 is a schematic structural view of an electronic device provided by another embodiment of the present application.

Please refer to FIG. 5. FIG. 5 is a schematic structural view of an electronic device provided by another embodiment of the present application. An electronic device 200 may include a display panel 100, a control circuit 60, and a housing 70. It should be noted that the electronic device 200 shown in FIG. 5 is not limited to the above-mentioned content, and may also include other devices, such as a camera, an antenna structure, a pattern unlocking module, and the like.

Specifically, the display panel 100 is disposed on the housing 70.

In one embodiment, the display panel 100 can be fixed to the housing 70, and the display panel 100 and the housing 70 form a closed space to accommodate the control circuit 60 and other devices.

In one embodiment, the housing 70 may be made of a flexible material, such as a plastic housing or a silicone housing.

Specifically, the control circuit 60 is assembled in the housing 70. The control circuit 60 may be a main board of the electronic device 200, and may be integrated with one, two or more of functional components, such as a battery, an antenna structure, a microphone, speaker, an earphone interface, universal serial bus interface, a camera, a distance sensor, an ambient light sensor, a receiver, and a processor.

The display panel 100 is assembled in the housing 70 and is electrically connected to the control circuit 60 to form a display surface of the electronic device 200. The display panel 200 may include a display area and non-display area. The display area is configured to display a screen of the electronic device 200 or for users' touch control. The non-display area can be used to set various functional components.

The electronic device includes, but is not limited to, mobile phones, tablet computers, computer monitors, game consoles, televisions, display screens, display panels, wearable devices, and other household appliances or household appliances with display functions.

Embodiments of the present application provide a flexible substrate and a method of manufacturing the same, and an electronic device, each including a first flexible substrate, a porous film layer disposed on the first flexible substrate, and a second flexible substrate disposed on the porous film layer. The porous film layer is configured to increase adhesion between the first flexible substrate and the second flexible substrate. Since the porous film layer is added between the first flexible substrate and the second flexible substrate, the adhesion between the first flexible substrate and the second flexible substrate is increased, thereby avoiding a risk of separation or even fall off of a dual layer flexible substrate during a manufacturing process, and improving process stability of a display panel and a stripping yield of a flexible substrate.

The flexible substrate and the method of manufacturing the same, and the electronic device provided by the embodiments of the present invention are described in detail above. Specific examples are used in this article to describe the principle and implementation of the application, and the description of the above examples is only used to help understand the application. Furthermore, for those skilled in the art, according to the idea of the application, there may be changes in the specific implementation and the scope of application. Accordingly, the content of this specification should not be construed as a limitation to the application.

What is claimed is:

1. A flexible substrate, comprising:
   a first flexible substrate;
   a porous film layer disposed on the first flexible substrate; and
   a second flexible substrate disposed on the porous film layer;
   wherein the porous film layer is configured to increase adhesion between the first flexible substrate and the second flexible substrate,
   wherein the porous film layer has a heat-resistant temperature greater than 500° C.

2. The flexible substrate of claim 1, wherein the porous film layer is made of a material comprising polyimide/inorganic nanohybrid material.

3. The flexible substrate of claim 2, wherein the inorganic nanohybrid material comprises at least one of titanium dioxide and silicon dioxide.

4. The flexible substrate of claim 1, wherein the porous film layer has a molecular chain structure comprising ether bonds and siloxane segments.

5. The flexible substrate of claim 1, wherein the porous film layer has a thickness less than five microns.

6. The flexible substrate of claim 1, wherein the porous film layer has a porosity greater than 50%.

7. The flexible substrate of claim 1, wherein the first flexible substrate has a thickness less than that of the second flexible substrate.

8. The flexible substrate of claim 1, wherein each of the first flexible substrate and the second flexible substrate is made of yellow polyimide.

9. An electronic device, comprising a flexible substrate, comprising:
- a first flexible substrate;
- a porous film layer disposed on the first flexible substrate; and
- a second flexible substrate disposed on the porous film layer;
- wherein the porous film layer is configured to increase adhesion between the first flexible substrate and the second flexible substrate,
- wherein the porous film layer has a heat-resistant temperature greater than 500° C.

10. The electronic device of claim 9, wherein the porous film layer is made of a material comprising polyimide/inorganic nanohybrid material.

11. The electronic device of claim 10, wherein the inorganic nanohybrid material comprises at least one of titanium dioxide and silicon dioxide.

12. The electronic device of claim 9, wherein the porous film layer has a molecular chain structure comprising ether bonds and siloxane segments.

13. The electronic device of claim 9, wherein the porous film layer has a thickness less than five microns.

14. The electronic device of claim 9, wherein the porous film layer has a porosity greater than 50%.

15. The electronic device of claim 9, wherein the first flexible substrate has a thickness less than that of the second flexible substrate.

16. The electronic device of claim 9, wherein each of the first flexible substrate and the second flexible substrate is made of yellow polyimide.

17. A method of manufacturing a flexible substrate, wherein the flexible substrate comprises: a first flexible substrate; a porous film layer disposed on the first flexible substrate; and a second flexible substrate disposed on the porous film layer; wherein the porous film layer is configured to increase adhesion between the first flexible substrate and the second flexible substrate, and wherein the porous film layer has a heat-resistant temperature greater than 500° C., wherein the method comprises:
- forming the first flexible substrate on a glass substrate;
- forming the porous film layer on the first flexible substrate;
- forming the second flexible substrate on the porous film layer; and
- separating the first flexible substrate from the glass substrate.

18. The method of manufacturing the flexible substrate of claim 17, wherein the second flexible substrate is being cured when the porous film layer is undergoing a curing process.

19. The method of manufacturing the flexible substrate of claim 18, wherein a curing temperature for the curing is greater than 400° C.

20. The method of manufacturing the flexible substrate of claim 17, wherein each of the first flexible substrate and the second flexible substrate is made of yellow polyimide.

* * * * *